United States Patent
Sakai et al.

(10) Patent No.: US 10,720,547 B2
(45) Date of Patent: Jul. 21, 2020

(54) METHOD OF MANUFACTURING SEMICONDUCTOR LIGHT EMITTING DEVICE

(71) Applicant: NIKKISO CO., LTD., Tokyo (JP)

(72) Inventors: Haruhito Sakai, Hakusan (JP); Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/422,468

(22) Filed: May 24, 2019

(65) Prior Publication Data

US 2019/0280149 A1    Sep. 12, 2019

Related U.S. Application Data

(63) Continuation of application No. PCT/JP2017/039606, filed on Nov. 1, 2017.

(30) Foreign Application Priority Data

Nov. 24, 2016  (JP) ................................ 2016-228136

(51) Int. Cl.
    *H01L 33/00*    (2010.01)
    *H01L 33/14*    (2010.01)
    (Continued)

(52) U.S. Cl.
    CPC ............ *H01L 33/007* (2013.01); *H01L 21/28* (2013.01); *H01L 21/3065* (2013.01);
    (Continued)

(58) Field of Classification Search
    CPC ... H01L 33/007; H01L 21/3065; H01L 33/32; H01L 33/0075
    See application file for complete search history.

(56) References Cited

U.S. PATENT DOCUMENTS

2002/0142563 A1*  10/2002  Sakai ................... H01L 29/452
                                                          438/410
2002/0155691 A1   10/2002  Lee et al.

FOREIGN PATENT DOCUMENTS

JP    H10-242576 A     9/1998
JP    2000-349067 A   12/2000
(Continued)

OTHER PUBLICATIONS

International Search Report and Written Opinion dated Jan. 9, 2017 issued in corresponding PCT Application No. PCT/JP2017/039606 (with English translations).
(Continued)

*Primary Examiner* — Mohammed R Alam
(74) *Attorney, Agent, or Firm* — Muncy, Geissler, Olds & Lowe, P.C.

(57) ABSTRACT

A method of manufacturing a semiconductor light emitting device includes: forming an active layer of an aluminum gallium nitride (AlGaN)-based semiconductor material on an n-type clad layer of an n-type AlGaN-based semiconductor material; forming a p-type semiconductor layer on the active layer; removing portions of the p-type semiconductor layer, the active layer, and the n-type clad layer so as to expose a partial region of the n-type clad layer; and forming an n-side electrode on the partial region of the n-type clad layer exposed. The removing includes first dry-etching performed by using both a reactive gas and an inert gas and second dry-etching performed after the first dry-etching by using a reactive gas.

8 Claims, 4 Drawing Sheets

(51) Int. Cl.
*H01L 33/32* (2010.01)
*H01L 33/36* (2010.01)
*H01L 21/28* (2006.01)
*H01L 21/3065* (2006.01)

(52) U.S. Cl.
CPC ............ *H01L 33/145* (2013.01); *H01L 33/32* (2013.01); *H01L 33/36* (2013.01); *H01L 2933/0016* (2013.01)

(56) References Cited

FOREIGN PATENT DOCUMENTS

| | | |
|---|---|---|
| JP | 2003-282543 A | 10/2003 |
| JP | 2004-104097 A | 4/2004 |
| JP | 2005-317684 A | 11/2005 |
| JP | 2008-218826 A | 9/2008 |
| JP | 5594530 B2 | 8/2014 |
| JP | 2016-012610 A | 1/2016 |
| JP | 2016-195148 A | 11/2016 |
| WO | WO 2013/046419 A1 | 4/2013 |

OTHER PUBLICATIONS

International Preliminary Examination Report on Patentability (II) dated Jan. 9, 2018 issued in corresponding PCT Application No. PCT/JP2017/039606 (with English translation).
Office Action dated Jan. 9, 2018 issued in corresponding Japanese Patent Application No. 2016-228136 (with English translation).
Office Action dated Apr. 17, 2018 issued in corresponding Japanese Patent Application No. 2016-228136 (with English translation).

\* cited by examiner

METHOD OF MANUFACTURING SEMICONDUCTOR LIGHT EMITTING DEVICE

RELATED APPLICATION

Priority is claimed to Japanese Patent Application No. 2016-228136, filed on Nov. 24, 2016, the entire content of which is incorporated herein by reference.

BACKGROUND OF THE INVENTION

1. Field of the Invention

The present invention relates to a method of manufacturing semiconductor light emitting devices.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have therefore attracted attention as a mercury free sterilization light source in medical and food processing fields. A light emitting device for emitting deep ultraviolet light includes an aluminum gallium nitride (AlGaN) based n-type clad layer, an active layer, a p-type clad layer stacked successively on a substrate. An n-side electrode is formed on a partial region of the n-type clad layer exposed by etching.

It is known that the larger the molar fraction of AlN of the n-type clad layer, the larger the contact resistance between the n-type clad layer and the n-side electrode tends to be and the more difficult it is to establish proper ohmic contact.

SUMMARY OF THE INVENTION

In this background, one illustrative purpose of the present invention is to provide a technology of increasing the light extraction efficiency of semiconductor light emitting devices.

A method of manufacturing a semiconductor light emitting device according to an embodiment of the present invention includes: forming an active layer of an aluminum gallium nitride (AlGaN)-based semiconductor material on an n-type clad layer of an n-type AlGaN-based semiconductor material; forming a p-type semiconductor layer on the active layer; removing portions of the p-type semiconductor layer, the active layer, and the n-type clad layer so as to expose a partial region of the n-type clad layer; and forming an n-side electrode on the partial region of the n-type clad layer exposed. The removing includes first dry-etching performed by using both a reactive gas and an inert gas and second dry-etching performed after the first dry-etching by using a reactive gas.

According to the embodiment, the amount of damage to the n-type clad layer exposed is reduced by switching from the first dry-etching that uses both the reactive gas and the inert gas to the second dry-etching that uses the reactive gas in the step of exposing the n-type clad layer. As a result, the n-side electrode can be formed on the less damaged n-type clad layer and the contact resistance of the n-side electrode is lowered. By using both the reactive gas and the inert gas in the first half of the removal step, the etching rate can be increased to the extent that the impact of damage to the exposed portion of the n-side clad layer is controlled to be small so that the productivity is increased.

The reactive gas may include at least one of chlorine ($Cl_2$), boron trichloride ($BCl_3$), and silicon tetrachloride ($SiCl_4$).

An etching rate of the second dry-etching may be lower than that of the first dry-etching.

An etching rate of the second dry-etching may be not more than 50 nm/minute.

An etching depth of the first dry-etching may be not less than 300 nm, and an etching depth of the second dry-etching may be not more than 300 nm.

The first dry-etching may remove at least the p-type semiconductor layer and the active layer and remove the n-type clad layer in part, and the second dry-etching may remove the n-type clad layer in part.

The method may further include causing nitrogen atoms (N) to react with the partial region of the n-type clad layer exposed before forming the n-side electrode.

The causing of nitrogen atoms to react may include decomposing ammonia ($NH_3$).

The causing of nitrogen atoms to react may include heating the n-type clad layer to a temperature not less than 100° C. and not less than 1000° C.

The n-type clad layer may have a molar fraction of AlN of 20% or higher.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
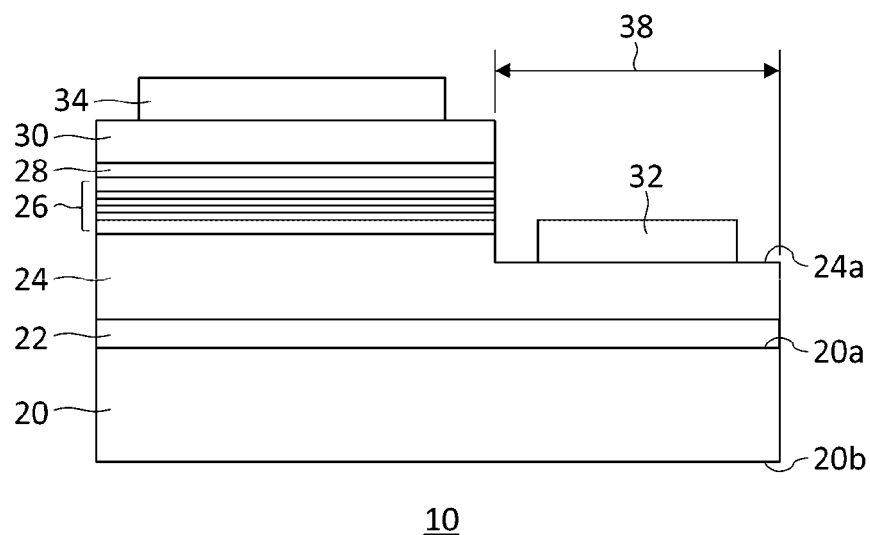
FIG. 1 is a cross-sectional view schematically showing a configuration of a semiconductor light emitting device according to the embodiment.

The invention will now be described by reference to the preferred embodiments. This does not intend to limit the scope of the present invention, but to exemplify the invention.

A detailed description will be given of embodiments to practice the present invention with reference to the drawings. Like numerals are used in the description to denote like elements and a duplicate description is omitted as appropriate. To facilitate the understanding, the relative dimensions of the constituting elements in the drawings do not necessarily mirror the relative dimensions in the actual apparatus.

FIG. 1 is a cross-sectional view schematically showing a configuration of a semiconductor light emitting device 10 according to the embodiment. The semiconductor light emitting device 10 is a light emitting diode (LED) chip configured to emit "deep ultraviolet light" having a central wavelength A of about 360 nm or lower. To output deep ultraviolet light having such a wavelength, the semiconductor light emitting device 10 is made of an aluminum gallium nitride (AlGaN) based semiconductor material having a band gap of about 3.4 eV or higher. The embodiment particularly discusses a case of emitting deep ultraviolet light having a central wavelength λ of about 240 nm-350 nm.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \le x+y \le 1$, $0 \le x \le 1$, $0 \le y \le 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light emitting device 10 includes a substrate 20, a buffer layer 22, an n-type clad layer 24, an active layer 26, an electron block layer 28, a p-type clad layer 30, an n-side electrode 32, and a p-side electrode 34.

The substrate 20 is a substrate having translucency for the deep ultraviolet light emitted by the semiconductor light emitting device 10 and is, for example, a sapphire ($Al_2O_3$) substrate. The substrate 20 includes a first principal surface 20a and a second principal surface 22b opposite to the first principal surface 20a. The first principal surface 20a is a principal surface that is a crystal growth surface for growing the buffer layer 22 and the layers above. The second principal surface 20b is a principal surface that is a light extraction substrate for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type lad layer 24 and the layers above. For example, the buffer layer 22 is an undoped AlN layer and is, specifically, an AlN (HT-AlN; High Temperature AlN) layer gown at a high temperature. The buffer layer 22 may include an undoped AlGaN layer formed on the AlN layer. In one variation, the buffer layer 22 may be formed only by an undoped AlGaN layer when the substrate 20 is an AlN substrate or an AlGaN substrate. In other words, the buffer layer 22 includes at least one of an undoped AlN layer and an AlGaN layer.

The n-type clad layer 24 is formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 20% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 μm-3 μm. For example, the n-type clad layer 24 has a thickness of about 2 μm.

The active layer 26 is made of an AlGaN-based semiconductor material and has a double heterojunction structure by being sandwiched by the n-type clad layer 24 and the electron block layer 28. The active layer 26 may have a monolayer or multilayer quantum well structure. For example, the active layer 26 may be formed by stack of a barrier layer made of an n-type AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 is formed on the n-type clad layer 24 but is not formed on the entirety of the n-type clad layer 24 and is formed only on a partial region (different than exposed region 38) on the n-type clad layer 24. In other words, the active layer 26 is not provided on an exposed surface 24a of the n-type clad layer 24.

The electron block layer 28 is formed on the active layer 26. The electron block layer 28 is a p-type AlGaN-based semiconductor material layer and is formed such that the molar fraction of AlN is 40% or higher, and, preferably, 50% or higher. The electron block layer 28 may be formed such that the molar fraction of AlN is 80% or higher or may be made of an AlN-based semiconductor material that does not substantially contain GaN. The electron block layer has a thickness of about 1 nm-10 nm. For example, the electron block layer has a thickness of about 2 nm-5 nm. The electron block layer 28 may not be a p-type layer and may be an undoped semiconductor layer.

The p-type clad layer 30 is a p-type semiconductor layer formed on the electron block layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed in a partial region (exposed region 38) on the n-type clad layer 24. The n-side electrode 32 is formed by a multilayer film in which titanium (Ti)/aluminum (Al)/Ti/gold (Au) are built on the n-type clad layer 24 successively. The p-side electrode 34 is formed on the p-type clad layer 30. The p-side electrode 34 is formed by a nickel (Ni)/gold (Au) multilayer film built on the p-type clad layer 30 successively.

Figure 2:
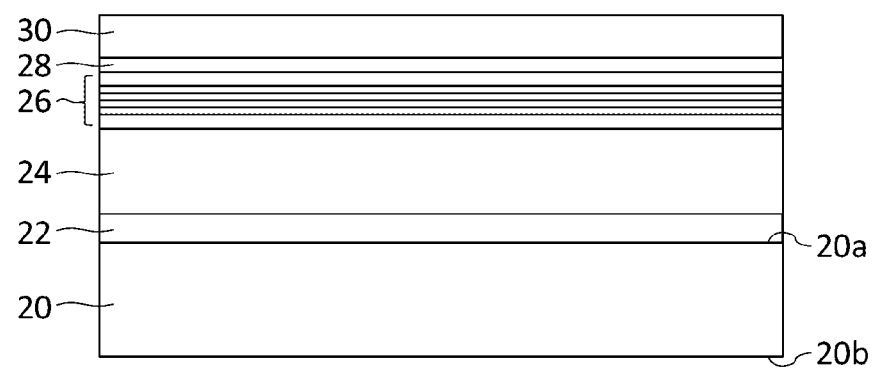
FIG. 2 schematically shows a step of manufacturing the semiconductor light emitting device.

A description will now be given of a method of manufacturing the semiconductor light emitting device 10. FIGS. 2-5 schematically show steps of manufacturing the semiconductor light emitting device 10. First, as shown in FIG. 2, the buffer layer 22, the n-type clad layer 24, the active layer 26, the electron block layer 28, and the p-type clad layer 30 are formed on the first principal surface 20a of the substrate 20 successively.

The substrate 20 is a sapphire ($Al_2O_3$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer gown at a high temperature and an undoped AlGaN (u-AlGaN) layer. The n-type clad layer 24, the active layer 26, the electron block layer 28, and the p-type clad layer 30 are layers made of an AlGaN-based semiconductor material, an AlN-based semiconductor material, or a GaN-based semiconductor material and can be formed by a well-known epitaxial growth method such as the metalorganic chemical vapor epitaxial (MOVPE) method and the molecular beam epitaxial (MBE) method.

Figure 3:
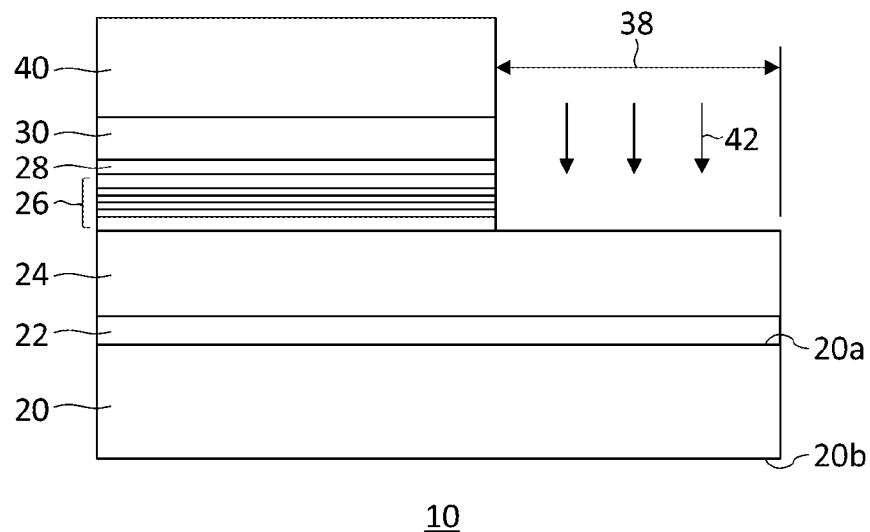
FIG. 3 schematically shows a step of manufacturing the semiconductor light emitting device.

Subsequently, as shown in FIG. 3, a mask 40 is formed on the p-type clad layer 30, and the active layer 26, the electron block layer 28, and the p-type clad layer 30 in the exposed region 38, in which the mask 40 is not formed, are removed. For removal of the active layer 26, the electron block layer 28, and the p-type clad layer 30, the first dry-etching using both a reactive gas and an inert gas is performed. The first dry-etching 42 is an reactive ion etching (RIE) step using an etching gas turned into a plasma and is, for example, inductive coupling plasma (ICP) etching.

In the first dry-etching 42, a gas including chlorine (Cl) is used as the reactive gas. Specifically, chlorine ($Cl_2$), boron trichloride ($BCl_3$), silicon tetrachloride ($SiCl_4$), or the like is used. Further, a noble gas such as argon (Ar) is used as an inert gas in the first dry-etching 42. In one example, an etching gas including three types, i.e., chlorine ($Cl_2$), boron trichloride ($BCl_3$), and argon (Ar), is used in the first dry-etching 42.

Figure 4:
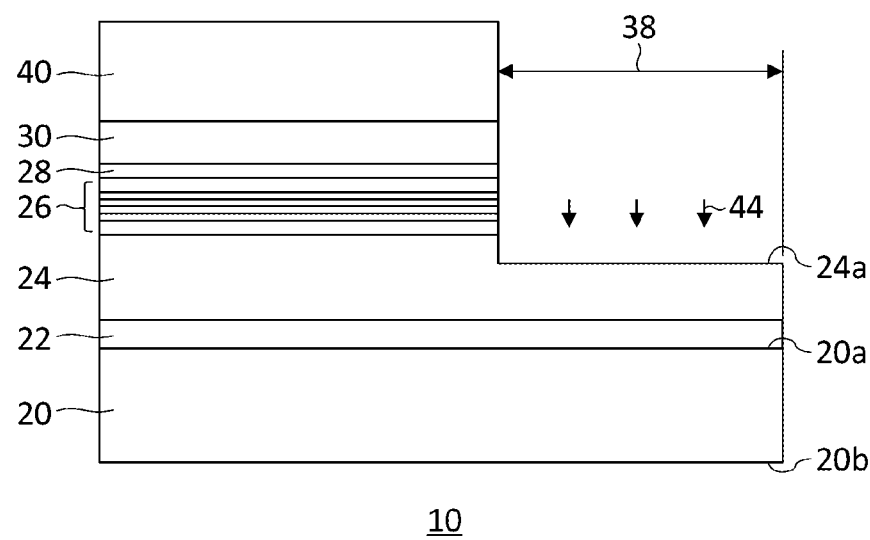
FIG. 4 schematically shows a step of manufacturing the semiconductor light emitting device.

Subsequently, as shown in FIG. 4, the second dry-etching 44 for removing a portion of the n-type clad layer 24 in the exposed region 38 is performed. Like the first dry-etching 42, the second dry-etching 44 is a reactive ion etching step and is, for example, ICP etching. In the second dry-etching 44, a reactive gas is used, but an inert gas is not used. In other words, only a reactive gas such as chlorine ($Cl_2$), boron trichloride ($BCl_3$), and silicon tetrachloride ($SiCl_4$) is used in the second dry-etching 44. In one example, an etching gas including chlorine ($Cl_2$) and boron trichloride ($BCl_3$) is used in the second dry-etching 44.

The second dry-etching 44 is a step in which the etching rate is lower than that of the first dry-etching 42. The etching rate of the first dry-etching 42 is 50 nm/minute or higher, but the etching rate of the second dry-etching 44 is 50 nm/minute or lower. For example, the etching rate of the first dry-etching 42 is 60-200 nm/minute, and the etching rate of the second dry-etching 44 is 1-50 nm/minute. In one example, the etching rate of the first dry-etching 42 is 100 nm/minute or 130 nm/minute, and the etching rate of the second dry-etching 44 is 2 nm/minute, 13 nm/minute, or 50 nm/minute.

In the second dry-etching 44, the etching rate can be made relatively lower by adjusting the power input to produce a plasma. Further, in the second dry-etching 44, the etching rate can be made relatively lower by not using an inert gas such as argon. When an inert gas such as argon is used, the n-type lad layer 24 is efficiently removed as $Ar^+$ ions etc. collide with the n-type clad layer 24 subject to etching. In the second dry-etching 44, a relatively lower etching rate is realized by inhibiting the physical removal action such as this. By inhibiting the physical removal action, the impact of damage to the n-type clad layer 24 that remains after etching is reduced, and the degradation in crystal quality in the vicinity of the exposed surface 24a of the n-type clad layer 24 exposed by the second dry-etching 44 is inhibited.

In the second dry-etching 44, it is preferred that the n-type clad layer 24 in a depth range in which the impact of damage due to the first dry-etching 42 remains be removed. Our knowledge show that, when the n-type clad layer 24 is etched by the first dry-etching 42, the damage impact due to the physical removal action remains in a depth range of about 10 nm-50 nm from the exposed surface. The damage impact from the physical removal action is exemplified by an increase in the bulk resistance due to the degradation in crystal quality. It is therefore be preferred that the etching depth of the n-type clad layer 24 in the second dry-etching 44 be 10 nm or larger, and, more preferably, 50 nm or larger. By applying the second dry-etching 44 to the depth range such as this, the degradation in crystal quality in the vicinity of the exposed surface 24a of the n-type clad layer 24 is inhibited, and the contact resistance between the n-type clad layer 24 and the n-side electrode 32 formed on the exposed surface 24a is suitably reduced.

Since the etching rate of the second dry-etching 44 is lower than that of the first dry-etching 42, the productivity of the removal step is lowered if the etching depth of the second dry-etching 44 is too large. It is preferred that the etching depth of the second dry-etching 44 be not less than 300 nm, which is satisfactorily larger than the aforementioned range of damage impact (10-50 nm), and, more preferably, not less than 200 nm. Meanwhile, it is preferred that the first dry-etching 42 be performed until the p-type clad layer 30, which has a relatively large thickness, is completely removed, and it is preferred that the etching depth of the first dry-etching 42 be 300 nm or larger.

In one variation, the first dry-etching 42 removes at least the p-type clad layer 30 in the exposed region 38. The first dry-etching 42 may remove the electron block layer 28 in the exposed region 38, and, further, the active layer 26 in the exposed region 38. The first dry-etching 42 may remove the n-type clad layer 24 in the exposed region 38 in part. On the other hand, the second dry-etching 44 removes the depth range not removed in the first dry-etching 42. The second dry-etching 44 removes at least the n-type clad layer 24 in the exposed region 38 in part. The second dry-etching 44 may remove the active layer 26 in the exposed region 38 at least in part and remove the electron block layer 28 in the exposed region 38 at least in part. The depth ranges removed by the first dry-etching 42 and the second dry-etching 44 respectively may be determined in accordance with the thickness of the active layer 26 and the electron block layer 28.

Figure 5:
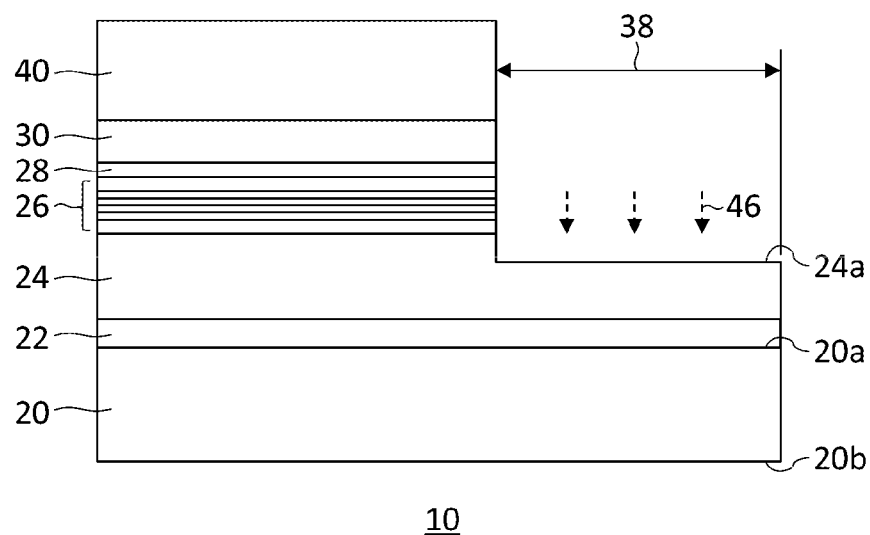
FIG. 5 schematically shows a step of manufacturing the semiconductor light emitting device.

Subsequently, as shown in FIG. 5, nitrogen atoms 46 are caused to react with the exposed surface 24a of the n-type clad layer 24 to supply nitrogen atoms to the exposed surface 24a. It is known that the impact of damage from etching induces nitrogen deficiency in the exposed surface 24a dry-etched as described above. Nitrogen deficiency induced in the n-type clad layer 24 functions as acceptors, which decrease the electron concentration in the vicinity of the exposed surface 24a and increases the bulk resistance. As a result, the contact resistance will be increased when the n-side electrode 32 is formed on the nitrogen deficient exposed surface 24a. This embodiment addresses the issue by supplying nitrogen atoms (N) in the presence of nitrogen deficiency caused by etching so as to decrease the number of nitrogen deficient sites and to lower the bulk resistance in the vicinity of the exposed surface 24a.

Supply of the nitrogen atoms 46 to the exposed surface 24a of the n-type clad layer 24 is performed by decomposing molecules containing nitrogen (N) to produce nitrogen atoms (N) and causing the nitrogen atoms to react with the exposed surface 24a. For example, nitrogen atoms are supplied to the exposed surface 24a of the n-type clad layer 24 by heating and decomposing ammonia ($NH_3$) so as to fix the damage such that the number of nitrogen deficient sites in the vicinity of the exposed surface 24a is reduced. The method of supplying nitrogen atoms is not particularly limited. For example, a device used in chemical vapor deposition (CVD) such as metalorganic chemical vapor deposition (MOCVD) or an annealing furnace may be used.

In the step of supplying the nitrogen atoms 46, damage recovery by way of supplying the nitrogen atoms 46 may be promoted by heating the n-type clad layer 24. The n-type clad layer 24 may be heated to a temperature of not less than 100° C. and not more than 1000° C.

The n-side electrode 32 is then formed on the exposed surface 24a of the n-type clad layer 24 supplied with nitrogen atoms to fix the damage. Further, the p-side electrode 34 is formed on the p-type clad layer 30 after the mask 40 is removed. The n-side electrode 32 and the p-side electrode 34 may be formed by a well-known method such as electron beam deposition and sputtering. This completes the semiconductor light emitting device 10 shown in FIG. 1.

Figure 6:
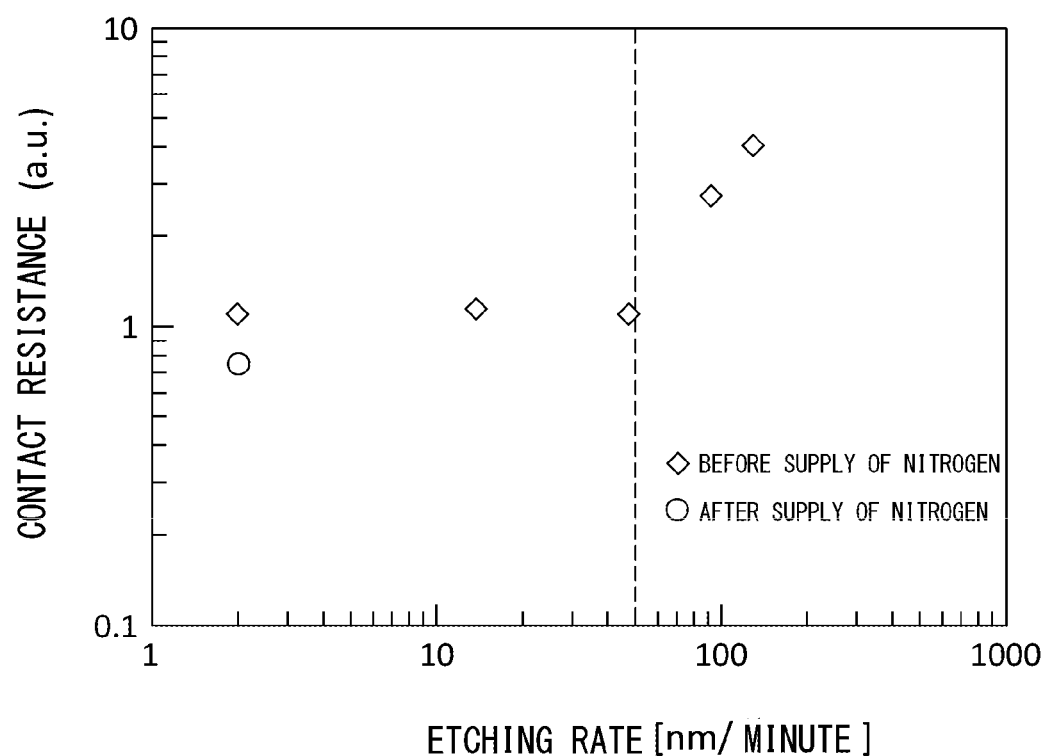
FIG. 6 is a graph showing a relationship between the etching rate of the n-type clad layer 24 and the contact resistance.

FIG. 6 is a graph showing a relationship between the etching rate of the n-type clad layer 24 and the contact resistance and shows the contact resistance of the exposed surface 24a occurring before the nitrogen atoms 46 are supplied and after they are supplied. The graph shows that the contact resistance of the n-type clad layer 24 is lowered by setting the etching rate of dry-etching for exposing the n-type clad layer 24 to be 50 nm/minute or lower before supplying the nitrogen atoms 46. The graph also shows that the contact resistance of the n-type clad layer 24 is further lowered by supplying the nitrogen atoms 46 after the n-type clad layer 24 is exposed by dry-etching.

Figure 7:
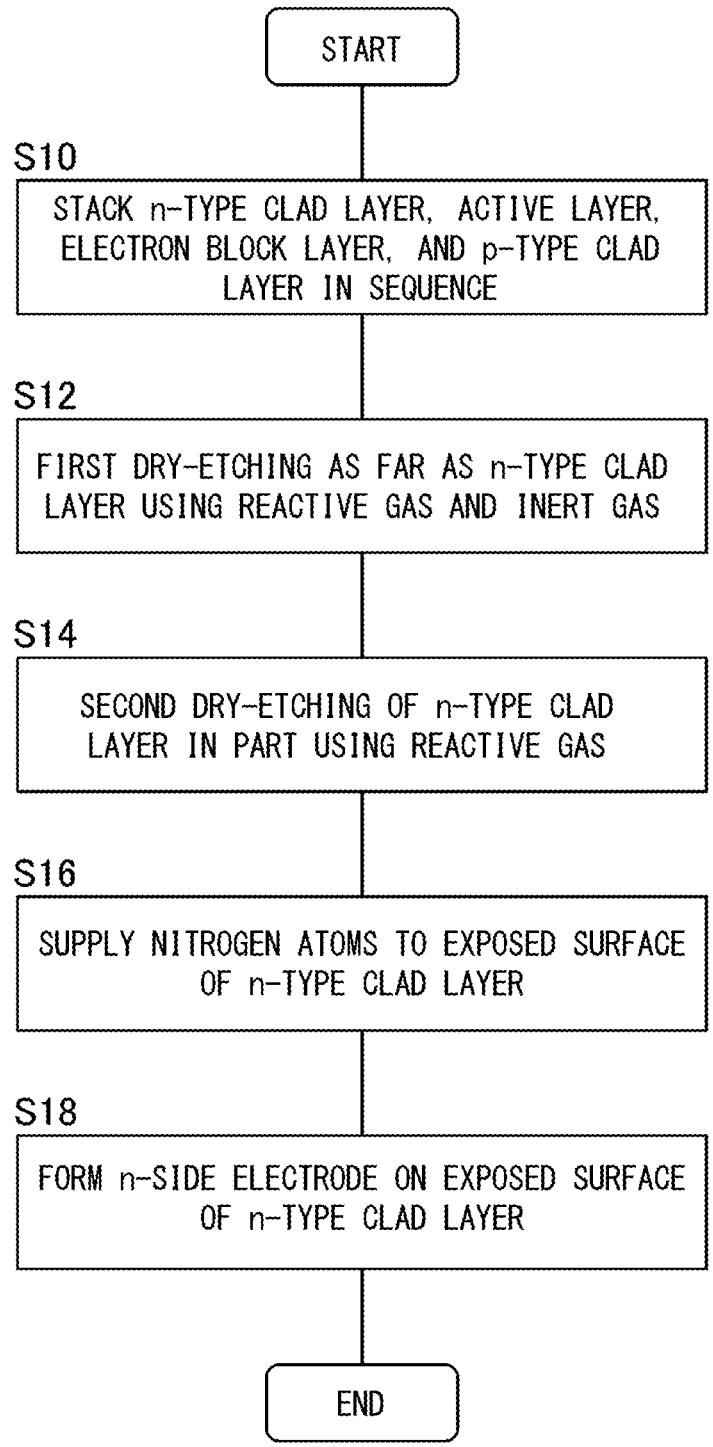
FIG. 7 is a flowchart showing a method of manufacturing the semiconductor light emitting device.

FIG. 7 is a flowchart showing a method of manufacturing the semiconductor light emitting device 10. First, the buffer layer 22, the n-type clad layer 24, the active layer 26, the electron block layer 28, and the p-type clad layer 30 are stacked on the substrate 20 successively (S10). Subsequently, the first dry-etching of removing the active layer 26, the electron block layer 28, and the p-type clad layer 30 located in the exposed region 38 is performed by using both a reactive gas and an inert gas (S12). In the first dry-etching step, the n-type clad layer 24 located in the exposed region 38 may be removed in part. Subsequently, the second dry-etching of removing the n-type clad layer 24 located in the exposed region 38 in part by using a reactive gas is performed (S14). This forms the exposed surface 24a of the n-type clad layer 24. The exposed surface 24a is then supplied with nitrogen atoms (N) to recover from nitrogen deficiency induced by dry-etching in the vicinity of the exposed surface 24a (S16). Finally, the n-side electrode 32 is formed on the exposed surface 24a recovered, and the p-side electrode 34 is formed on the p-type clad layer 30.

According to the embodiment, the contact resistance between the n-type clad layer 24 and the n-side electrode 32 is reduced, and the forward voltage occurring when the semiconductor light emitting device 10 is driven is reduced.

In a comparative example in which the exposed surface 24a of the n-type clad layer 24 is formed by the first dry-etching 42, the contact resistance of the n-type clad layer 24 will have a value exceeding $2\times10^{-2}$ $\Omega cm^2$. According to an example corresponding to the embodiment, on the other hand, the contact resistance of the n-type clad layer 24 is improved to about $1\times10^{-3}$ $\Omega cm^2$. The n-type clad layer 24 according to the comparative example and the example is made of an AlGaN-based semiconductor material having a molar fraction of AlN of about 65%. The contact resistance of the n-type clad layer 24 according to the example is of a value that compares favorably with the unetched n-type clad layer 24.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment described above, the case of combining the second dry-etching 44 of a lower etching rate with damage recovery by way of supplying the nitrogen atoms 46 has been described. In one variation, only one of the approaches may be applied. In one variation, the n-side electrode 32 may be formed without supplying the nitrogen atoms 46 after the exposed surface 24a of the n-type clad layer 24 is formed by the second dry-etching 44. In an alternative variation, the nitrogen atoms 46 may be supplied to the exposed surface 24a without performing the second dry-etching 44 after the exposed surface 24a of the n-type clad layer 24 is formed by the first dry-etching 42, and the n-side electrode 32 may be formed after the damage is fixed.

What is claimed is:

1. A method of manufacturing a semiconductor light emitting device comprising: forming an active layer of an aluminum gallium nitride (AlGaN)-based semiconductor material on an n-type clad layer made of n-type AlGaN having a molar fraction of AlN of 20% or higher; forming a p-type semiconductor layer on the active layer; removing portions of the p-type semiconductor layer, the active layer, and the n-type clad layer so as to expose a partial region of the n-type clad layer; and forming an n-side electrode on the partial region of the n-type clad layer exposed, wherein the removing includes first dry-etching performed by using both a reactive gas and an inert gas and second dry-etching performed after the first dry-etching by using only the reactive gas, an etching rate of the second dry-etching is not more than 50 nm/minute, and an etching depth formed by the second dry-etching is not less than 50 nm and not more than 300 nm.

2. The method of manufacturing a semiconductor light emitting device according to claim 1, wherein
the reactive gas includes at least one of chlorine ($Cl_2$), boron trichloride ($BCl_3$), and silicon tetrachloride ($SiCl_4$).

3. The method of manufacturing a semiconductor light emitting device according to claim 1, wherein the etching rate of the second dry-etching is lower than that of the first dry-etching.

4. The method of manufacturing a semiconductor light emitting device according to claim 1, wherein an etching depth formed by the first dry-etching is not less than 300 nm.

5. The method of manufacturing a semiconductor light emitting device according to claim 1, wherein
the first dry-etching removes at least the p-type semiconductor layer and the active layer and removes the n-type clad layer in part, and the second dry-etching removes the n-type clad layer in part.

6. The method of manufacturing a semiconductor light emitting device according to claim 1, further comprising:
   causing nitrogen atoms (N) to react with the partial region of the n-type clad layer exposed before forming the n-side electrode.

7. The method of manufacturing a semiconductor light emitting device according to claim 6, wherein
   the causing of nitrogen atoms to react includes decomposing ammonia ($NH_3$).

8. The method of manufacturing a semiconductor light emitting device according to claim 6, wherein the causing of nitrogen atoms to react includes heating the n-type clad layer to a temperature not less than 100° C. and not more than 1000° C.

* * * * *